United States Patent
Bremner

(10) Patent No.: US 6,204,716 B1
(45) Date of Patent: Mar. 20, 2001

(54) TRANSIENT SIGNAL DETECTOR

(75) Inventor: Duncan James Bremner, Lochwinnoch (GB)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/438,021

(22) Filed: Nov. 10, 1999

Related U.S. Application Data

(63) Continuation of application No. 09/053,193, filed on Apr. 1, 1998, now Pat. No. 6,028,464.

(51) Int. Cl.$^7$ .................................................. H03K 5/08
(52) U.S. Cl. ............................ 327/309; 327/74; 330/257
(58) Field of Search ................................. 327/52, 53, 65, 327/66, 74, 310, 563, 309; 330/252, 257, 253

(56) References Cited

U.S. PATENT DOCUMENTS

| | | | |
|---|---|---|---|
| 5,376,898 | 12/1994 | Tanaka et al. | 330/253 |
| 5,736,866 | * 4/1998 | Harr | 326/18 |

* cited by examiner

*Primary Examiner*—Timothy P. Callahan
*Assistant Examiner*—Minh Nguyen
(74) *Attorney, Agent, or Firm*—Baker & McKenzie

(57) ABSTRACT

A transient signal detector for monitoring a signal line and generating a control signal which indicates when the magnitude of a differential signal on the line exceeds either a positive or negative threshold value. The threshold value is defined by a single current, thereby allowing for a single, simple adjustment of such threshold in both the positive and negative directions.

9 Claims, 2 Drawing Sheets

TRANSIENT SIGNAL DETECTOR

RELATED APPLICATIONS

This application is a continuation of U.S. patent application Ser. No. 09/053,193, filed Apr. 1, 1998, now U.S. Pat. No. 6,028,464.

BACKGROUND OF THE INVENTION

1. Field of the Invention

The present invention relates to transient signal detectors, and in particular, to transient signal detectors for detecting transient signal excursions which exceed threshold levels in both positive and negative directions.

2. Description of the Related Art

Many circuit applications can benefit from, or in many cases absolutely require, some form of transient signal detection whereby signals within the monitored signal path which exceed some predetermined threshold and which are frequently transient in nature can be reliably detected. This will allow appropriate responsive action to be initiated, such as filtering or suppression of such transient signals.

One such circuit application is that of a subscriber line interface circuit (SLIC) for telecommunications. Signal transients in a telecommunication environment are quite common. For example, aside from any transient signals introduced by the operating environment (e.g., electrical motors, lightning strikes, ground loops, etc.), transients due to transitions between on-hook and off-hook conditions and normal dialing impulses caused by rotary telephones are often encountered. For many applications, such transients can be problematic and result in unreliable or otherwise unacceptable circuit performance.

Monitoring transient signals in a SLIC application, while already difficult, can be further complicated by the fact that the signal environment is differential in nature due to the "tip" and "ring" signal connections. Accordingly, transient signals with both positive and negative differential signal polarities can be and often are encountered. Accordingly, it would be desirable to have a simple transient signal detection circuit which can detect both positive and negative signal transients in a differential signal environment.

SUMMARY OF THE INVENTION

A transient signal detector in accordance with the present invention provides for the monitoring of a signal line and the generating of a control signal which indicates when the magnitude of the differential signal on the line exceeds either a positive or negative threshold value. Such threshold value can be defined by a single circuit parameter, such as a current, thereby allowing for a single, simple adjustment of the threshold for both the positive and negative threshold values.

In accordance with one embodiment of the present invention, a transient signal detector for monitoring a signal and indicating when such signal has a magnitude which extends in either direction outside of a range defined by positive and negative threshold values includes a differential buffer circuit, an output circuit and a current sinking circuit. The differential buffer circuit is configured to receive a differential signal and in accordance therewith selectively provide first and second currents. The first current is provided when the differential signal has a first polarity and a magnitude which exceeds a first threshold value. The second current is provided when the differential signal has a second polarity and a magnitude which exceeds a second threshold value. The output circuit is configured to selectively convey a third current. The current sinking circuit is coupled to the differential buffer circuit and the output circuit and is configured to: sink the first current when the differential signal has the first polarity and the differential signal magnitude exceeds the first threshold value; sink the second current when the differential signal has the second polarity and the differential signal magnitude exceeds the second threshold value; sink the third current when the differential signal has the first polarity and the differential signal magnitude is less than the first threshold value; and sink the third current when the differential signal has the second polarity and the differential signal magnitude is less than the second threshold value.

In accordance with another embodiment of the present invention, a method of monitoring a signal and indicating when such signal has a magnitude which extends in either direction outside of a range defined by positive and negative threshold values includes the steps of:

receiving a differential signal and in accordance therewith
generating a first internal current when the differential signal has a first polarity and a magnitude which exceeds a first threshold value, and
generating a second internal current when the differential signal has a second polarity and a magnitude which exceeds a second threshold value;

sinking the first internal current when the differential signal has the first polarity and the differential signal magnitude exceeds the first threshold value;

sinking the second internal current when the differential signal has the second polarity and the differential signal magnitude exceeds the second threshold value;

sinking an external current when the differential signal has the first polarity and the differential signal magnitude is less than the first threshold value; and sinking the external current when the differential signal has the second polarity and the differential signal magnitude is less than the second threshold value.

These and other features and advantages of the present invention will be understood upon consideration of the following detailed description of the invention and the accompanying drawings.

DETAILED DESCRIPTION OF THE INVENTION

Figure 1:
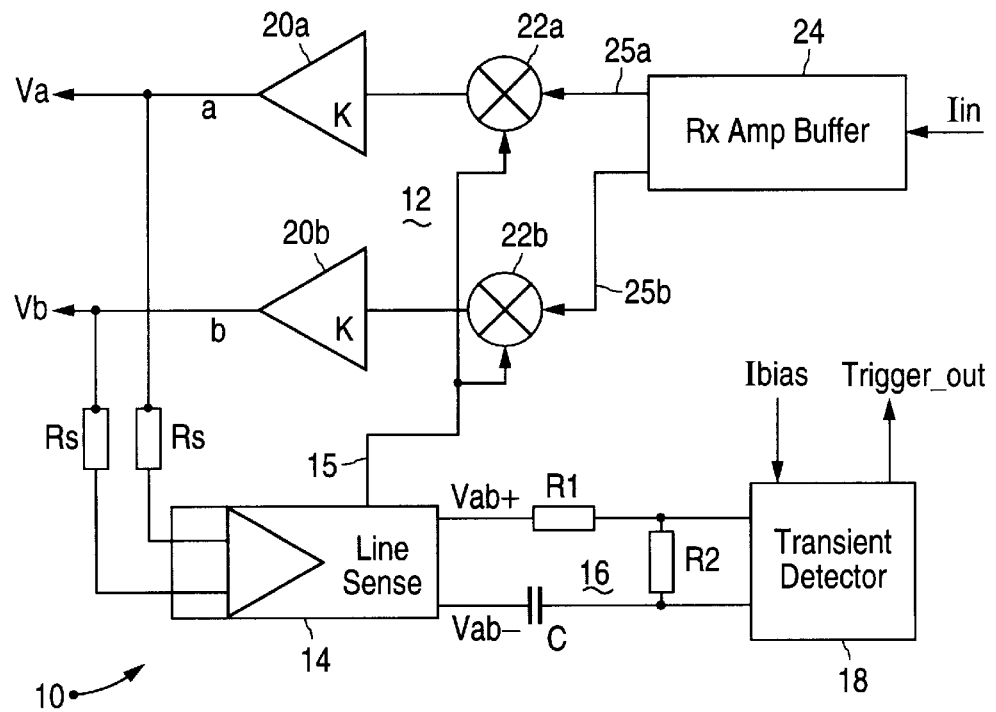
FIG. 1 is a functional block and circuit schematic diagram of a subscriber line interface circuit containing a transient signal detector in accordance with one embodiment of the present invention.

Referring to FIG. 1, a SLIC 10 containing a transient signal detector in accordance with one embodiment of the present invention includes a drive circuit 12, a line sense stage 14, a filter circuit 16 and a transient detector stage 18, interconnected substantially as shown. The drive circuit 12 includes two amplifiers 20a, 20b which drive the individual subscriber lines at nodes a and b. In turn, these amplifiers 20a, 20b are driven by signals 25a, 25b from a receiver amplifier buffer 24, following the mixing of such signals 25a, 25b with the feedback signal from the sense circuit 14. The sense circuit 14 senses voltages Va and Vb at nodes a and b, respectively, via sense resistors Rs.

In accordance with well known principles, the line sense stage 14 monitors the individual line voltages Va, Vb via the sense resistors Rs. In addition to the feedback signal 15 for the driver circuit 12, the line sense stage 14 also generates a differential voltage Vab having a "positive" phase Vab+ and a "negative" phase Vab−. This differential signal Vab+/Vab− is applied to the filter 16 which is a high-pass filter formed by a serial connection of two resistors R1, R2 and a capacitor C. The differential voltage across the second resistor R2 is applied to the transient detector stage 18. (With resistor values of R1=467 kilohms and R2=33 kilohms and a capacitor value of C=0.22 microfarad, a pole is formed at 1.5 Hertz and a fractional value of 1/15 of the input differential signal Vab+/Vab− is generated across resistor R2.) The transient detector 18 receives a bias current Ibias and generates a trigger output signal (discussed in more detail below).

Figure 2:
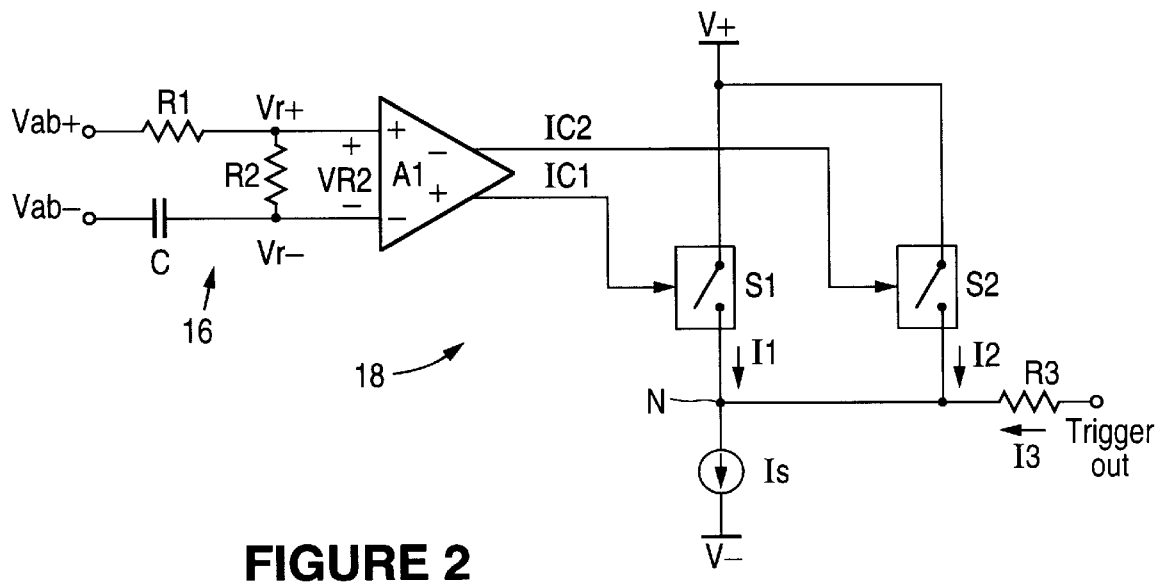
FIG. 2 is a circuit schematic and functional block diagram of a transient signal detector in accordance with one embodiment of the present invention.

Referring to FIG. 2, the function performed by the transient detector stage 18 can be represented as shown. The fractional differential voltage Vr+/Vr− across the second resistor R2 is applied to the inputs of a differential amplifier stage A1 which generates two control signals (e.g., currents) IC1, IC2. Control signals IC1 and IC2 are activated when respective opposing peak excursions of the voltage VR2=(Vr+)−(Vr−) across resistor R2 are greater in magnitude than predetermined opposing (e.g., "positive" and "negative") threshold values (discussed in more detail below). When control signal IC1 is activated, switch S1 is closed, thereby allowing current I1 to flow into node N. When control signal IC2 is activated, switch S2 is closed, thereby allowing current I2 to flow into node N. These control signals IC1, IC2 are activated in a mutually exclusive manner, i.e., only one control signal IC1, IC2 is active at one time.

When neither control signal IC1, IC2 is active, current I3 flows through the output resistor R3 into node N and is sunk by the current source circuit Is to the negative power supply terminal V−. Whenever one of the control signals IC1, IC2 is activated, its corresponding current I1, I2 is sunk by the current source Is and output current I3 is zero. Hence, if the voltage VR2 across resistor R2 remains within the predetermined positive and negative threshold values, output current I3 flows and a voltage is generated across the output resistor R3. However, if the input voltage VR2 is greater in magnitude than either threshold value, regardless of polarity, current I3 is cut off and either current I1 or current I2 is sunk by the current source circuit Is.

Figure 3:
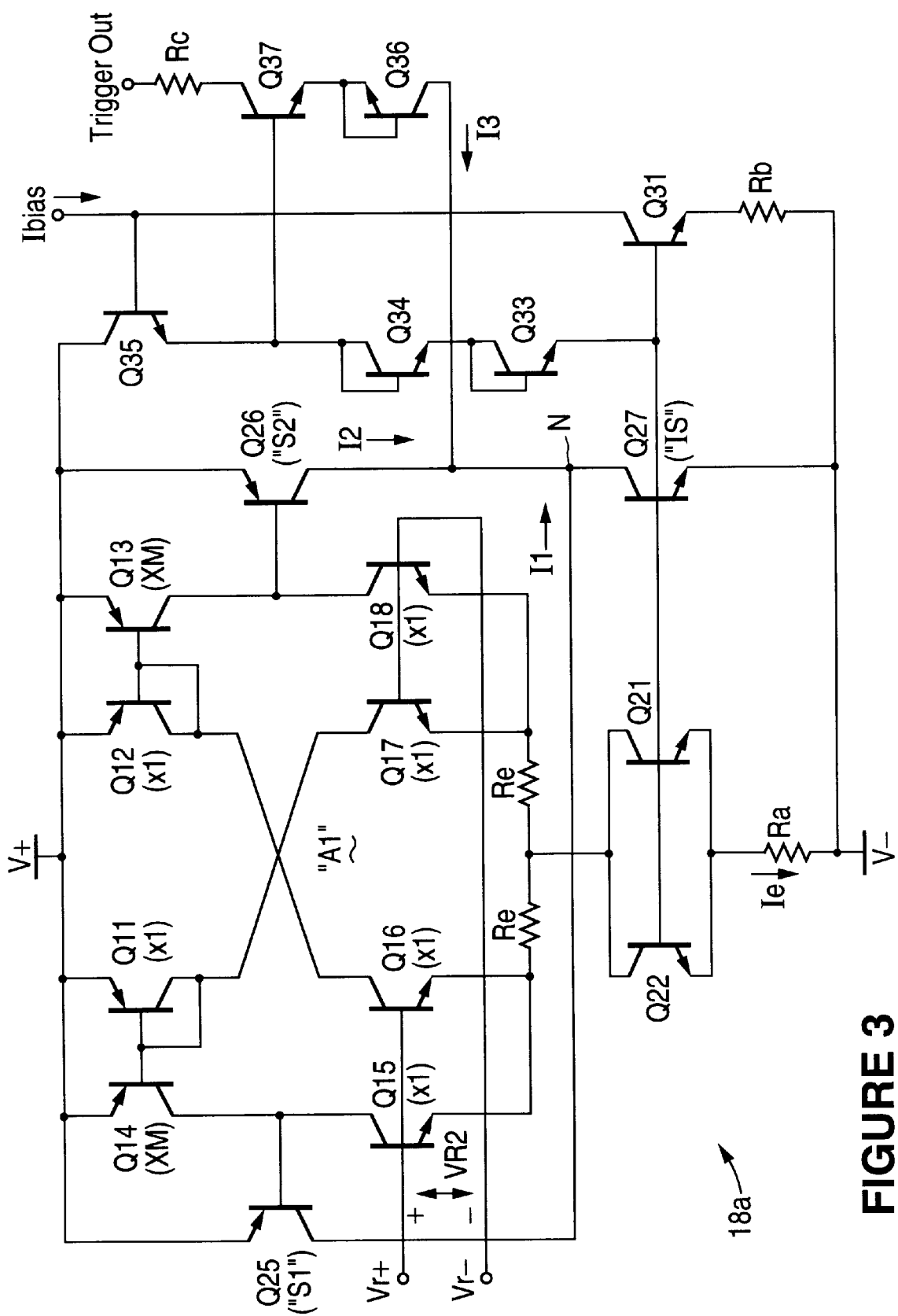
FIG. 3 is a circuit schematic diagram of a transient signal detection circuit in accordance with a preferred embodiment of the present invention.

Referring to FIG. 3, a preferred embodiment 18a of the transient detector stage 18 of FIG. 2 includes a number of PNP transistors Q11, Q12, Q13, Q14, Q25, Q26, a number of NPN transistors Q15, Q16, Q17, Q18, Q21, Q22, Q27, Q31, Q33, Q34, Q35, Q36, Q37, and several resistors Re, Ra, Rb, Rc, all interconnected substantially as shown. The differential amplifier A1 includes a dual differential amplifier (one being composed of transistors Q15 and Q18 and the other being composed of transistors Q16 and Q17), cross-coupled to two current mirrors (one being composed of transistors Q11 and Q14 and the other being composed of transistors Q12 and Q13). The "switch" circuits S1, S2 are implemented as current amplifying switch circuits in the form of transistors Q25 and Q26. The input bias current Ibias, via transistors Q31, Q33, Q34 and Q35, establishes the biasing for transistors Q21, Q22 and Q27, thereby establishing the current sinking capability of transistor Q27 (Is), as well as the current source operation of transistors Q21 and Q22 to generate a tail current Ie for the differential amplifier A1.

Transistors Q11, Q12, Q15, Q16, Q17 and Q18 are all identical in size (x1), while transistors Q13 and Q14 are ratioed to be larger by a factor of M (xM). Two resistors Re serve as emitter degeneration resistors for the dual differential amplifiers (Q15/Q18, Q16/Q17). Input voltage Vr+ is applied to the bases of transistors Q15 and Q16, while input voltage Vr− is applied to the bases of transistors Q17 and Q18.

During quiescent operation, both input voltages Vr+, Vr− are at equal potentials. Accordingly, the output nodes of the differential amplifier A1, i.e., the collectors of transistors Q14, Q15, Q13 and Q18, are holding the output buffer transistors Q25, Q26 in an "off" state by sourcing and sinking equal currents with transistors Q14 and Q15 and transistors Q13 and Q18, respectively. Consequently, currents I1 and I2 are zero and current I3 (via an output circuit formed by transistors Q36 and Q37 and resistor Rc) flows into node N and is sunk by transistor Q27, thereby indicating that the input voltage VR2 is inside the threshold potentials.

As the input voltage VR2 increases, however, an operating point is reached where the current sharing of transistors Q15, Q16, Q17 and Q18 is such that the net output current ceases to hold off the bases of transistors Q25 and Q26. Accordingly, one of these output transistors Q25, Q26 turns on and substitutes either current I1 or I2 for current I3 at node N. Hence, output current I3 drops to zero, thereby indicating that one of the input threshold levels has been exceeded.

The threshold level which is the same for either polarity of the input voltage VR2 is determined by the ratio M of the devices within the current mirrors, the emitter degeneration resistance Re and the tail current Ie and is computed in accordance with the following equation:

$$Vth=|(1-M)/(1+M)|*Ie*Re+Vt*ln(M)$$

(where Vth is the threshold voltage level, Vt is the kT/q factor for bipolar transistors (where k=Boltzman's constant, T=temperature in degrees Kelvin and q=electronic charge), approximately equal to 26 millivolts at 300° Kelvin, and "ln(M)" represents the natural logarithm of factor M). For a tail current Ie of 5 microamperes, an emitter degeneration resistance Re of 64 kilohms, a transistor ratio M of 2.5, the threshold voltage Vth is 150 millivolts.

As should be understood from the foregoing discussion, a transient signal detector in accordance with the present invention can be advantageously used in virtually any application where a simple method is needed for detecting when an incoming signal has exceeded a threshold level. Such a circuit is economical with respect to circuit area and does not require complex matching arrangements. However, for high precision applications, the layout of the circuit devices should be cross-coupled. Further, where the thresholds are not symmetric about a mean value, the emitter degeneration resistors Re, or, alternatively, the current mirror ratio M on one side, may be offset from each other so as to provide a different threshold level in one direction.

Further, as should also be understood in accordance with the foregoing discussion, a transient signal detector in accordance with the present invention need not necessarily be implemented only with bipolar technology, i.e., bipolar junction transistors. Rather, such a circuit can also be implemented with MOS technology, i.e., metal oxide semiconductor field effect transistors (MOSFETs). For example, in place of bipolar devices as shown in FIG. 3, counterpart MOS devices (e.g., P-MOSFET for PNP and N-MOSFET for NPN) can be used instead with appropriate substitutions of drain, source and gate terminal connections for the corresponding collector, emitter and base terminal connections of the counterpart bipolar devices, respectively.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a transient signal detector for monitoring a signal and indicating when such signal has a magnitude which extends in either direction outside of a range defined by positive and negative threshold values, comprising:

a differential buffer circuit that following reception of a differential signal selectively provides first and second currents, wherein said first and second currents are mutually exclusive, said first current is provided when said differential signal has a first polarity and a magnitude which exceeds a first threshold value, said second current is provided when said differential signal has a second polarity and a magnitude which exceeds a second threshold value, and each of said first and second currents is substantially zero when said differential signal has said first polarity and said differential signal magnitude is less than said first threshold value and when said differential signal has said second polarity and said differential signal magnitude is less than said second threshold value;

an output circuit that selectively conveys a third current following reception thereof; and a current sinking circuit that is coupled to said differential buffer circuit and said output circuit and that sinks said first current via a common current path when said differential signal has said first polarity and said differential signal magnitude exceeds said first threshold value, sinks said second current via said common current path when said differential signal has said second polarity and said differential signal magnitude exceeds said second threshold value, sinks said third current via said common current path when said differential signal has said first polarity and said differential signal magnitude is less than said first threshold value, and sinks said third current via said common current path when said differential signal has said second polarity and said differential signal magnitude is less than said second threshold value, whereby one of said first, second and third currents exclusively is sunk by said current sinking circuit via said common current path.

2. The apparatus of claim 1, wherein said differential buffer circuit comprises:

a differential amplifier circuit that following reception of said differential signal provides first and second control signals; and a current switching circuit, coupled to said differential amplifier circuit, that following reception of said first and second control signals provides said first and second currents.

3. The apparatus of claim 2, wherein said current switching circuit comprises:

a first switch circuit that following reception of said first control signal provides said first current; and a second switch circuit that following reception of said second control signal provides said second current.

4. The apparatus of claim 1, wherein said current sinking circuit comprises a current source circuit that selectively conducts one of said first, second and third currents.

5. The apparatus of claim 1, further comprising a signal division circuit that is coupled to said differential buffer circuit, receives and divides an input signal and provides said differential signal.

6. A method of monitoring a signal and indicating when such signal has a magnitude which extends in either direction outside of a range defined by positive and negative threshold values, said method comprising the steps of:

receiving a differential signal and in response thereto generating a first internal current with a first nonzero magnitude when said differential signal has a first polarity and a magnitude which exceeds a first threshold value, generating a second internal current with a second nonzero magnitude when said differential signal has a second polarity and a magnitude which exceeds a second threshold value, and maintaining said first and second internal currents at first and second substantially zero magnitudes when said differential signal has said first polarity and said differential signal magnitude is less than said first threshold value and when said differential signal has said second polarity and said differential signal magnitude is less than said second threshold value, wherein said first and second internal currents are mutually exclusive;

sinking said first internal current via a common current path when said differential signal has said first polarity and said differential signal magnitude exceeds said first threshold value;

sinking said second internal current via said common current path when said differential signal has said second polarity and said differential signal magnitude exceeds said second threshold value;

sinking an external current via said common current path when said differential signal has said first polarity and said differential signal magnitude is less than said first threshold value; and sinking said external current via said common current path when said differential signal has said second polarity and said differential signal magnitude is less than said second threshold value;

whereby one of said first and second internal currents and said external current exclusively is sunk at one time via said common current path.

7. The method of claim 6, wherein said step of receiving a differential signal and in response thereto generating first and second internal currents comprises:

receiving said differential signal and in response thereto generating first and second control signals; and receiving said first and second control signals and in response thereto generating said first and second currents.

8. The method of claim 7, wherein said step of receiving said first and second control signals and in response thereto generating said first and second currents comprises receiving said first and second control signals and in response thereto switching said first and second currents on and off.

9. The method of claim 6, further comprising the step of receiving and dividing an input signal and in response thereto generating said differential signal.

* * * * *